United States Patent [19]

Martin

[11] Patent Number: 5,748,028

[45] Date of Patent: May 5, 1998

[54] METHOD AND APPARATUS FOR MULTI-LEVEL INPUT VOLTAGE RECEIVER CIRCUIT

[75] Inventor: Douglas Ele Martin, Round Rock, Tex.

[73] Assignee: International Business Machines Corporation, Armonk, N.Y.

[21] Appl. No.: 741,731

[22] Filed: Oct. 31, 1996

[51] Int. Cl.⁶ ............................................. H03K 17/04
[52] U.S. Cl. ..................... 327/374; 327/109; 327/388; 327/389; 327/434; 326/83; 326/87
[58] Field of Search ...................... 327/108–112, 333, 327/170, 374–377, 388, 389, 434; 326/62–82, 83, 86, 87

[56] References Cited

U.S. PATENT DOCUMENTS

| | | | |
|---|---|---|---|
| 3,395,290 | 7/1968 | Farina et al. | 361/91 |
| 3,947,727 | 3/1976 | Stewart | 361/91 |
| 4,605,980 | 8/1986 | Hartranft et al. | 361/56 |
| 4,772,979 | 9/1988 | Arras | 361/90 |
| 4,802,054 | 1/1989 | Yu et al. | 361/91 |
| 4,868,705 | 9/1989 | Shiochi et al. | 361/91 |
| 4,930,037 | 5/1990 | Woo | 361/58 |
| 5,159,518 | 10/1992 | Roy | 361/56 |
| 5,319,258 | 6/1994 | Ruetz | 327/108 |
| 5,378,945 | 1/1995 | Partovi | 326/68 |
| 5,383,080 | 1/1995 | Etoh et al. | 361/56 |
| 5,565,794 | 10/1996 | Porter | 326/81 |

*Primary Examiner*—Kenneth B. Wells
*Attorney, Agent, or Firm*—Anthony V. S. England

[57] ABSTRACT

The invention is embodied in a receiver and a method for responding to an input signal. The input signal is received in a first stage of the receiver, which generates a first stage output signal responsive thereto. If the input signal does not exceed a first level, the first stage output signal is generated by an overvoltage element. That is, for this case, the overvoltage element passes the input signal through to the first stage output, and the first stage output voltage is not increased by a first stage pullup element. If, on the other hand, the input signal exceeds the first level, the first stage output signal voltage level is increased by the first stage pullup element to a higher output voltage level. The output signal from the first stage is received in a second stage. The second stage generates a second stage output responsive thereto. A second stage pullup element may be disabled by a mode signal in expectation that the input signal will exceed the first level, so that the first stage output voltage will not be increased by the second stage pullup element.

5 Claims, 2 Drawing Sheets

METHOD AND APPARATUS FOR MULTI-LEVEL INPUT VOLTAGE RECEIVER CIRCUIT

FIELD OF THE INVENTION

This invention relates generally to receivers in information processing systems, and more specifically may apply to receivers adaptable for differing input signal voltage LEVELS.

CROSS REFERENCE TO RELATED PATENT APPLICATIONS

None

BACKGROUND OF THE INVENTION

The internal voltage supply of an integrated circuit and the corresponding voltage level of signals which can be handled by the circuit are influenced by the requirements and limitations of fabrication technology used for the circuit. It is not unusual for a computer system to have integrated circuits which are fabricated using somewhat different technologies requiring different internal voltage supplies. These circuits within the system must nevertheless communicate with one another. For example, a microprocessor integrated circuit may be fabricated using a certain complementary metal oxide semiconductor ("CMOS") technology which requires a nominal 2.5 volt internal voltage supply (Vdd), while other devices which communicate with the microprocessor on the computer system interface bus or memory bus are fabricated using a somewhat different CMOS technology requiring a nominal 3.3 volt internal voltage supply (OVdd). The devices having the OVdd internal voltage supply may require a logic high signal, such as one inputted from the microprocessor, to approach OVdd, while the microprocessor can only supply a high level signal approaching Vdd. Also, if OVdd exceeds certain maximum source-to-drain or gate oxide breakdown voltages for FET's in a device, the device may require that a logic low signal, such as one inputted from the microprocessor, be limited to some voltage sufficiently above ground to prevent damage.

It is known by persons of ordinary skill in the art to use circuitry as shown in FIG. 1 for receiving input signals of varying voltage levels, such as for a signal with a 2.5 volt maximum in one application and a signal with a 3.3 volt maximum in another.

Referring now to FIG. 1, QN7, QN8, QN9 and QN10 are connected as pass gates, with their gates connected to Vdd, their drains tied together at node 112, and their sources tied to resistors, Z1, Z2, Z3 and Z4 respectively. The four resistors are all tied on their other side to the input terminal for receiving an input signal. These four FET's and four resistors provide an overvoltage protection function to prevent the rest of the devices in circuit 100 from being damaged by an excessively high voltage input signal.

Connected to node 112, the output of the overvoltage protection circuitry, are FET's QN1 and QP1 connected as an inverter to receive the overvoltage circuitry output. The source of QN1 is tied to the drain of QN2, which receives the external Enable signal at its gate. The drains of QN1 and QP1 are tied to the drain of the other FET, QP2, which also has its gate connected to the Enable line.

The drains of QN1 and QP1 are also connected to the gate of QP6, which acts as a half latch, with its source connected to Vdd, and its drain connected through resistor Z6, to node 112. The gate of QP6 is also connected through the source-drain of FET's QP8 and QP9 to Vdd. The gate of QP8 is connected to node 112. The gate of QP9 is connected to a Mode line for receiving an external Mode signal. The Mode signal is switched depending on whether the input signal will reach at least Vdd. (The case where the input signal will reach at least Vdd is referred to hereinafter as the "high input voltage mode", and the case where the input signal will not reach at least Vdd is referred to hereinafter as the "low input voltage mode".)

The drains of QN1 and QP1 are also connected to inverter QP3/QN3. The QP3/QN3 inverter output (i.e., the interconnected drain of QN3 and of QP3) is connected to inverter QP4/QN4, which has its output connected to inverter QP5/QN5, which has its output connected to the output line.

For the purpose of analyzing circuitry 100 operation, begin with an initial condition, wherein the input signal is low; the Enable signal is high; node 112 is low; QP1, QN2, QN3, QP4 and QN5 are on; QP2, QP3, QP5 and QP6 are off; and the output is low. Also, begin with the Mode signal high, for the low input voltage mode case, so that QP9 is off.

The Enable signal stays high to enable operation of the receiver by holding QP2 off and QN2 on.

When the input signal goes high, node 112 follows the signal up to a limit of Vdd-Vt, due to NFET's QN7, QN8, QN9 and QN10 connected as pass gates to protect against overvoltage on the input signal. The rising voltage on node 112 tends to turn off QP1 (and tends to turn on QN1). However, the voltage on node 112 will not rise to a sufficiently high level to fully turn off QP1, due to the pass gates. Thus, an undesirable "leakage" current will flow from Vdd through QP1 and QN1 to ground. Therefore, QP6 is provided, so that the rising voltage on node 112, tending to turn off QP1 and turn on QN1, and thus tending to pull node 124 low, tends to turn on QP6, further contributing to pulling up node 112. This feedback pulls up 112 fully to Vdd, so that QN1 is turned fully on and QP1 is turned fully off, despite the limitation imposed by the pass gates on the effect of the input signal on node 112.

With node 124 low, this turns on QP3 (and turns off QN3), which turns off QP4 (and turns on QN4), which turns on QP5 (and turns off QN5), pulling the output high.

When the input signal goes low, QP6 opposes node 112 following the signal down. However, QP6 is selected to be a small FET so that the voltage on node 112 does follow the input signal down, although more slowly than the input signal. Node 112 voltage falling tends to turn on QP1 (and turn off QN1), tending to pull up node 124. Node 124 rising tends to turn off QP6, reducing the QP6 opposition to the falling voltage on node 112, so that node 112 does eventually follow the input signal to the low state and node 124 likewise eventually goes fully high. Node 124 high also turns off QP3 (and turns on QN3), which turns on QP4 (and turns off QN4), which turns off QP5 (and turns on QN5), pulling the output low.

As can be seen from the above description, the speed of response of circuitry 100 suffers due to trade offs made for the sake of voltage protection. A need therefore exists for an improved receiver, which provides overvoltage protection but without the extent of speed reduction as in the prior art.

SUMMARY OF THE INVENTION

An objective of the invention is to reduce receiver response time for outputting a signal responsive to an input signal.

According to the present invention, the foregoing and other objects are attained by a receiver and a method for responding to an input signal. The input signal is received in a first stage, which generates a first stage output signal responsive thereto.

The first stage output signal is generated by an overvoltage element if the input signal does not exceed a first level. The overvoltage element passes the input signal through to the output up to a second, lower input signal level.

The first stage output signal is generated by a pullup element at an output signal level higher than the second level, if the input signal exceeds the first level.

The output signal from the first stage is received in a second stage. The second stage generates a second stage output responsive thereto. The second stage output does not use a second stage pullup element if the input signal exceeds the first level.

In a further aspect, the invention contemplates using a second stage pullup element if the input signal does not exceed the first level, and disabling the second stage pullup element when the input signal is expected to exceed the first level, in order to avoid the pullup element opposing the input signal.

In yet a further aspect, the invention contemplates that overvoltage protection in the first stage circuitry includes a pass gate.

In still a further aspect, the invention contemplates that first stage pullup circuitry includes a transistor having a modulating electrode operably connected to the input signal, one conducting electrode connected to a voltage supply and another conducting electrode connected to the pass gate.

And that second stage circuitry includes a number of inverters operably connected in series, wherein the first inverter in the series has an input operably connected to the first stage.

It is an advantage of the present invention that faster response to the input signal is achieved.

It is another advantage that the invention protects the circuitry against overvoltage, including electrostatic discharge.

Additional objects, advantages, and novel features are set forth in the following description, or will be apparent to those skilled in the art or those practicing the invention. Other embodiments are within the spirit and scope of the invention. These objects and embodiments may be achieved by the combinations pointed out in the appended claims. The invention is intended to be limited only as defined in the claims.

DETAILED DESCRIPTION

To clearly point out novel features of the present invention, the following discussion omits or only briefly describes conventional features which are apparent to those skilled in the art concerning CMOS technology, and receiving signals by an off-chip receiver. It is assumed that those skilled in the art are familiar with the details of CMOS technology, high frequency switching and transmission line effects, such as described in *Circuit Design for CMOS VLSI*, by John P. Uyemura, 1992, Kluwer Academic Publishers, which is hereby incorporated herein by reference.

Figure 2:
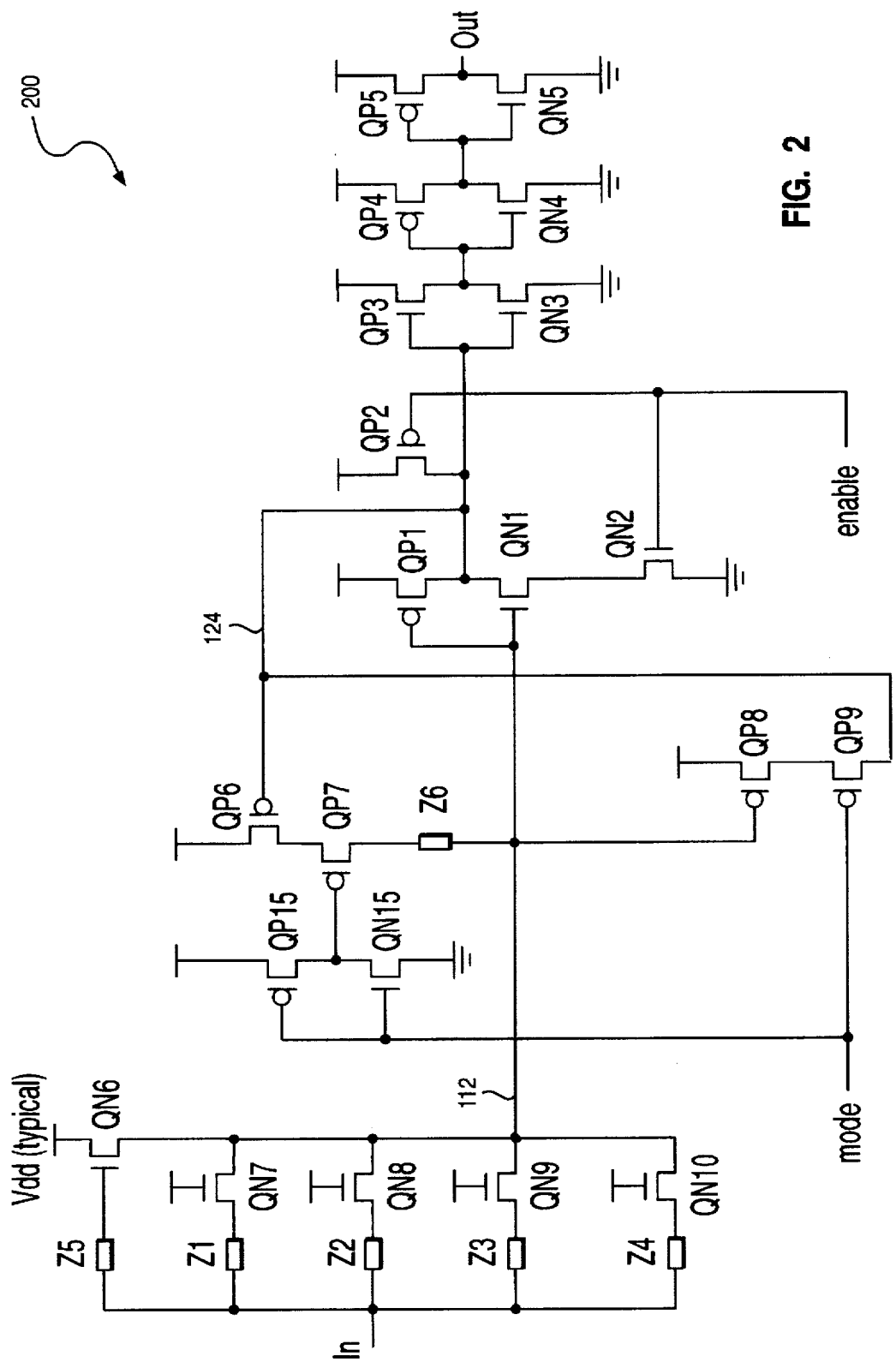
FIG. 2 is a schematic diagram of circuitry embodying the invention.

Referring to FIG. 2, a schematic diagram of the preferred embodiment is shown. Circuitry 200 has a number of the elements of circuitry 100, which are interconnected in similar fashion. But circuitry 200 has additional elements which provide the enhanced function and performance of circuitry 200. As understood by a person of ordinary skill in the art, the like elements and similar interconnection in circuitry 200 need not be elaborately described. Therefore, the additional elements and their interconnection will be the primary focus of the following description.

In the preferred embodiment, the voltage supply Vdd is 2.5 volts. In low input voltage mode, the input signals are expected to be 2.5 volts maximum. In high input voltage mode, the input signals are expected to be 3.3 volts maximum.

In FIG. 2 FET QN6 and resistor Z5 have been added to the overvoltage protection circuitry previously described. The resistor Z5 is tied to the input line in similar fashion as resistors Z1 through Z4. The other terminal of resistor Z5 is tied to the gate of QN6. In other words, resistor Z5 operably couples the pullup FET QN6 to the input line. The drain of QN6 is tied to voltage supply Vdd, and the source is tied to previously described node 112. (Herein, the gate of an FET may also be referred to by the term "modulating electrode", which applies to transistors in general. And, likewise, the source and drain of an FET may be referred to as the "conducting electrodes".)

The resistors in circuitry 200 may be of diffusion, metal, polysilicon, or some other type. They generally are provided to protect the FET's of the circuitry against both electrostatic discharge, which typically arises at the input line due to handling of the circuitry, and overvoltage of the input signal. QN6 is not as sensitive to overvoltage as is QN1, because QN6 is connected to Vdd and not to ground. Therefore, although QN6 is not protected by the pass gates QN7 through QN10, nevertheless QN6 is not as susceptible to damage as QN1 would be without the pass gates.

QP7 has been added, with its source-drain in series with QP6, between QP6 and resistor Z6. Thus, the pullup, or half-latch, FET QP6 is operably coupled through FET QP7 and resistor Z6 to node 112.

The mode line now also connects the Mode signal to the gates of additional inverter QP15/QN15. The output (i.e. interconnected drains) of inverter QP15/QN15 goes to the gate of QP7.

Figure 1:
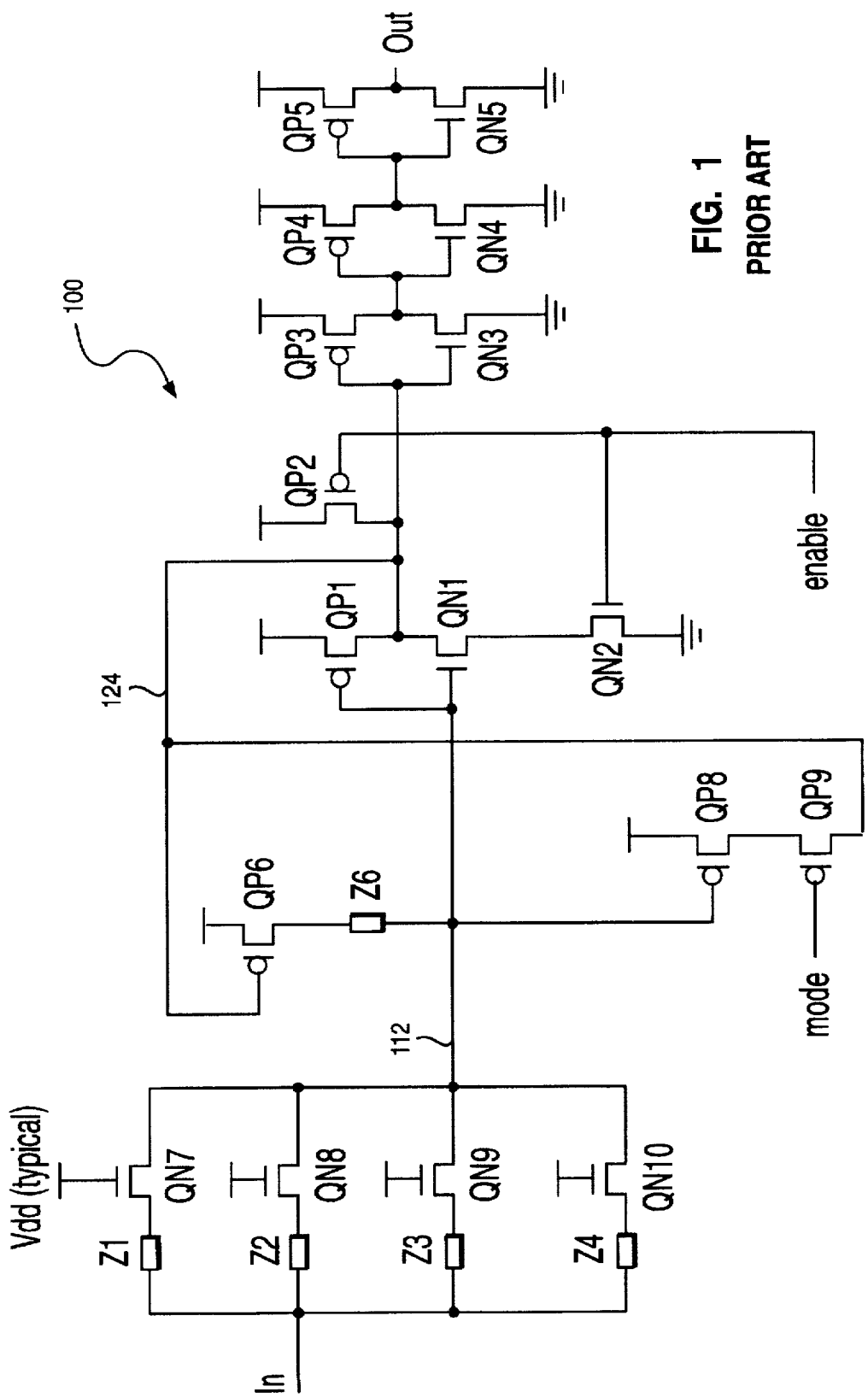
FIG. 1, as described above, is a schematic diagram of a prior art receiver.

With the additional elements and connections for circuitry 200, the operation and performance is changed and enhanced as will be described herein. To more clearly point out the differences in the invention and that of the prior art, consider first, however, the high input signal voltage case, for the circuitry 100 of FIG. 1.

Beginning with initial conditions, wherein the input signal is low; the Enable signal is high; node 112 is low; QP1, QN2, QN3, QP4 and QN5 are on; QP2, QP3, QP5 and QP6 are off; and the output is low. The Mode signal is low so that QP9 is on, so that in this case the state of QP8 is of consequence. QP8 is initially on due to node 112 being low. With both QP8 and QP9 on, this contributes further to the high voltage level on the gate of QP6, holding QP6 off.

The Enable signal stays high to enable operation of the receiver by holding QP2 off and QN2 on.

When the input signal goes high, node 112 follows the signal up to a limit of Vdd-Vt, due to NFET's QN7, QN8, QN9 and QN10 connected as pass gates for overvoltage and electrostatic discharge protection. The rising voltage on node 112 tends to turn off QP1 (and tends to turn on QN1), and also tends to turn off QP8. However, as in the earlier case, the voltage on node 112 will not rise to a sufficiently high level to fully turn off QP1 and QP8 solely due to the rising input signal, due to the pass gates, so without other devices in the circuitry to affect node 112 in this circumstance there would be an undesirable leakage current.

In this high input voltage mode, the rising voltage on node 112 tending to turn off QP1 and QP8, and to turn on QN1, tends to pull node 124 low and turn on QP6. This further contributes to pulling up node 112. Again, as in the low input voltage mode, this feedback tends to pull up 112 fully to Vdd, so that QP1 is turned fully off and QN1 is turned fully on, eliminating the large leakage current despite the limitation imposed by the pass gates on the effect of the input signal on node 112. In the high input voltage mode, however, the feedback also includes QP8 and QP9 in this case. With QP9 on, QP8 is effectively in parallel with QP1, and thereby increases the PFET/NFET gain ratio of the QP1/QN1 inverter. This raises the voltage threshold level for switching the QP1/QN1 inverter.

The increased switching threshold voltage level for the inverter QP1/QN1 results in a higher switching threshold for the overall circuit 100. That is, on a rising input signal voltage, the switching of QP1 and QN1 is at a higher input signal voltage, as is the resulting switching of QP6, and the three inverters QP3/QN3, QP4/QN4 and QP5/QN5 on the circuit 100 output. Likewise, when the input signal goes low, the switching of QP1 and QN1 is at a higher input signal voltage, as is the resulting switching of QP6, and the three inverters QP3/QN3, QP4/QN4 and QP5/QN5 on the circuit 100 output. Thus, the input signal voltage threshold (also referred to as "switch point") for transitioning to both the high and low logic states has been effectively raised by enabling QP8 via the Mode signal and QP9.

The low input voltage mode is used when input signals received are expected to be 2.5 volts maximum. In this mode the switch point is about 0.4×Vdd=1.0 volts, which is 0.4 times the input signal max voltage. The high input voltage mode is used when input signals are expected to be 3.3 volts maximum. In this mode the switch point is about 0.6×Vdd= 1.5 volts, which is 0.45 times the input signal max voltage. Thus by switching the input voltage mode operation of the circuit to accommodate these two different input signals the switch point of the circuit is kept reasonably close to the same, in terms of the input signal max voltage. That is, 0.4 times the input signal max voltage is about the same as 0.45 times the input signal max voltage.

Now, consider the circuitry 200 of FIG. 2 for the high input voltage mode. In this mode, the Mode signal is low turning on QP15 and turning off QN15, which turns QP7 off. The low Mode signal also turns QP9 on. When the input signal goes high, as it reaches a level exceeding that of node 112 by at least the turn on voltage of QN6 (i.e., QN6 "threshold voltage, Vt"), this turns on QN6, because its gate is operably coupled to the input line through resistor Z5. With QN6 on, this pulls up node 112 to Vdd.

Thus, node 112 is pulled up to a switching threshold voltage level of the QP1/QN1 inverter through QN6 more quickly than in circuitry 100, because in circuitry 100 node 112 is pulled up to the threshold level in response to a high input signal only after the added delay of switching through QP1, QP8 and QP6.

Also, because node 112 is pulled up to essentially Vdd by QN6 this eliminates the leakage current that otherwise would flow through QP1, without the need to have QP6 do so. Furthermore, since QP6 is now not needed at all to pull up node 112 for the high input voltage mode, and can therefore be defeated by turning off QP7, QP6 does not oppose node 112 going low as in circuitry 100. This speeds up the response in circuitry 200 to an input signal going from high to low.

For the low input voltage mode in circuitry 200, the Mode signal is high turning off QP15 and turning on QN15, which turns QP7 on. The high Mode signal also turns QP9 off. Then, when the input signal goes high, node 112 follows the signal up to a limit of Vdd-Vt, due to NFET's QN7, QN8, QN9 and QN10 connected as pass gates to protect against overvoltage on the input signal. The rising voltage on node 112 tends to turn off QP1 (and tends to turn on QN1). As previously described, the voltage on node 112 will not rise to a sufficiently high level to fully turn off QP1, due to the pass gates, except that with QP6 the rising voltage on node 112, tending to turn off QP1 and turn on QN1, tends to pull node 124 low and thus to turn on QP6, further contributing to pulling up node 112. This feedback pulls up 112 fully to Vdd, so that QN1 is turned fully on and QP1 is turned fully off, despite the limitation imposed by the pass gates on the effect of the input signal on node 112. With node 124 low, this turns on QP3 (and turns off QN3), which turns off QP4 (and turns on QN4), which turns on QP5 (and turns off QN5), pulling the output high.

When the input signal goes low, QP6 opposes node 112 following the signal down. However, as before, the small FET, QP6, does allow the voltage on node 112 to follow the input signal down, although imposing some delay. Node 112 voltage falling tends to turn on QP1 (and turn off QN1), tending to pull up node 124. Node 124 rising tends to turn off QP6, reducing the QP6 opposition to the falling voltage on node 112, so that node 112 does eventually follow the input signal to the low state and node 124 likewise eventually goes fully high. Node 124 high also turns off QP3 (and turns on QN3), which turns on QP4 (and turns off QN4), which turns off QP5 (and turns on QN5), pulling the output low.

From the description set forth above it may be seen that the circuitry of the invention has a number of advantages. Node 112, the input to the QP1/QN1 inverter, is pulled up to a switching threshold voltage level through QN6 more quickly than in a circuit employing feedback from the inverter. Also, since feedback FET, QP6, is now not needed at all to pull up node 112 for the high input voltage mode, and can therefore be defeated by turning off QP7, QP6 does not oppose node 112 going low as in circuitry 100. Furthermore, the three inverters QP3/QN3, QP4/QN4 and QP5/QN5 provide gain so that the output signal transition time and block delay remain more nearly constant for both of the anticipated input signal types. The gain provided by these inverters also helps keep block delay more nearly constant for a range of loads on the output.

Although the present invention and its advantages have been described in detail, it should be understood that various changes, substitutions and alterations can be made without departing from the spirit and scope of the invention as defined by the following claims.

What is claimed is:

1. A receiver circuit, comprising:
  first stage circuitry for receiving an input signal, wherein the first stage circuitry includes:
    a first stage output node,
    first pullup circuitry coupled to an input node and the first stage output node for driving a voltage on the first stage output node in response to the input signal, and circuitry for overvoltage protection coupled to the input node; and second stage circuitry coupled to the first stage output node, wherein the second stage circuitry includes:
second pullup circuitry coupled to the first stage output node for driving the voltage on the first stage output node in response to the input signal, and
circuitry for disabling the second pullup circuitry when the receiver is used in a high voltage input signal mode, so that the second pullup circuitry, when disabled, will not oppose the input signal driving the first stage output node voltage downward.

2. The receiver of claim 1, wherein the overvoltage protection circuitry includes a pass gate.

3. The receiver of claim 2, wherein the first pullup circuitry includes a transistor having a modulating electrode operably connected to the input node, one conducting electrode connected to the voltage supply and another conducting electrode connected to the first stage output node.

4. A receiver, comprising:
first circuitry, including:
a pass gate having a first and second conducting electrode, the first conducting electrode being coupled to an input node for receiving an input signal and protecting against overvoltage of the signal, and
a first pullup transistor having a modulating electrode and a first and second conducting electrode, the modulating electrode being coupled to the input node for receiving the input signal, one of the first pullup transistor conducting electrodes being connected at a first stage output node to the pass gate second conducting electrode, and the other of the first pullup transistor conducting electrodes being for operable connection to a voltage supply; and second circuitry, including:
a number of inverters operably connected in series, wherein the first inverter in the series has an input operably connected to the first stage output node,
a second pullup transistor having a modulating electrode and a first and second conducting electrode, the modulating electrode being operably connected to an output node of the first inverter, one of the conducting electrodes being operably connected to the first stage output node, and the other of the electrodes being for operable connection to the voltage supply, and
a disabling transistor having a modulating electrode and a first and second conducting electrode, the disabling transistor modulating electrode being for receiving a control signal, and the disabling transistor conducting electrodes being interposed between the second pullup transistor and the first stage output node.

5. In a receiver circuit having i) first stage circuitry, including a first stage output node, first pullup circuitry and circuitry for overvoltage protection, and ii) second stage circuitry, operably connected to the first stage output node, including second pullup circuitry, a method comprising the steps of:

disabling the second pullup circuitry when the receiver is used in a high voltage input signal mode;

enabling the second pullup circuitry when receiver is used in a low voltage input signal mode;

receiving the input signal by the first stage circuitry;

driving the first stage output node upward toward essentially a voltage supply level by the first pullup circuitry in response to the input signal rising when the second pullup circuitry is disabled, wherein the first stage output node voltage is allowed to fall in response to the input signal falling, and the second pullup circuitry, being disabled, does not oppose the first stage output node voltage falling; and driving the first stage output node toward essentially the voltage supply level using the first and second pullup circuitry, in response to the input signal rising when the second pullup circuitry is enabled.

* * * * *